US010310017B2

(12) United States Patent
Som et al.

(10) Patent No.: US 10,310,017 B2
(45) Date of Patent: Jun. 4, 2019

(54) DETECTION OF GENERATOR STATOR INTER-CIRCUIT FAULTS

(71) Applicant: GENERAL ELECTRIC COMPANY, Schenectady, NY (US)

(72) Inventors: Shantanu Som, Dubai (AE); Zeeky Ashiono Bukhala, Clifton Park, NY (US)

(73) Assignee: General Electric Company, Schenectady, NY (US)

( * ) Notice: Subject to any disclaimer, the term of this patent is extended or adjusted under 35 U.S.C. 154(b) by 352 days.

(21) Appl. No.: 15/335,073

(22) Filed: Oct. 26, 2016

(65) Prior Publication Data

US 2017/0074941 A1 Mar. 16, 2017

Related U.S. Application Data

(63) Continuation-in-part of application No. 13/613,721, filed on Sep. 13, 2012, now abandoned.

(51) Int. Cl.
*G01R 19/02* (2006.01)
*G01R 31/02* (2006.01)
*G01R 31/34* (2006.01)

(52) U.S. Cl.
CPC .......... *G01R 31/346* (2013.01); *G01R 19/02* (2013.01); *G01R 31/02* (2013.01); *G01R 31/343* (2013.01)

(58) Field of Classification Search
CPC .... G01R 31/343; G01R 31/346; G01R 31/02; G01R 19/02
See application file for complete search history.

(56) References Cited

U.S. PATENT DOCUMENTS 4,795,983 A  1/1989  Crockett et al.
4,964,058 A  10/1990 Brown, Jr.
(Continued)

FOREIGN PATENT DOCUMENTS

CN  1560976 A   1/2005
CN  101702512 A  5/2010

OTHER PUBLICATIONS

Luo et al., "Multiple Coupled Circuit Modeling of Induction Machines", IEEE Transactions on Industry Applications, vol. 31, No. 2, pp. 311-318 (Year: 1995).*

(Continued)

*Primary Examiner* — Regis J Betsch
(74) *Attorney, Agent, or Firm* — Ernest G. Cusick; Hoffman Warnick LLC (57) ABSTRACT

Aspects of the invention provide a system and method for detecting inter-circuit faults within a generator stator. In one embodiment, a computer system includes: a sampler for sampling phase voltages and phase currents of a generator stator; a plurality of pre-defined blocks for enabling, based on the sampled phase voltages and currents, an inter-circuit fault detection scheme; a level detection block for determining, in response to the enabled inter-circuit fault detection scheme, a plurality of differences between the sampled phase voltages; and a comparison logic device for comparing, in response to the enabled inter-circuit fault detection scheme, each of the differences of the sampled phase voltages and determining, based on the differences, an inter-circuit fault within at least one phase of the generator stator. The system may also include a negative sequence voltage block for detection of inter-circuit fault within a generator stator.

20 Claims, 8 Drawing Sheets

(56) References Cited

U.S. PATENT DOCUMENTS

| | | | |
|---|---|---|---|
| 5,514,978 A | 5/1996 | Koegl et al. | |
| 5,608,327 A | 3/1997 | Jones et al. | |
| 5,929,549 A * | 7/1999 | Trago | H02K 16/04 310/112 |
| 6,020,711 A * | 2/2000 | Rubertus | H02K 7/1823 318/254.2 |
| 6,611,771 B1 | 8/2003 | Habetler et al. | |
| 7,663,849 B2 | 2/2010 | Shah et al. | |
| 7,834,573 B2 | 11/2010 | Lindsey et al. | |
| 8,823,307 B2 * | 9/2014 | Gajic | G01R 31/343 318/490 |
| 2007/0085549 A1 | 4/2007 | Fischer | |
| 2008/0042683 A1 * | 2/2008 | Kasztenny | H02H 1/0092 324/765.01 |
| 2008/0284391 A1 | 11/2008 | Al-Shyoukh et al. | |
| 2009/0091289 A1 | 4/2009 | Nandi et al. | |
| 2010/0194323 A1 | 8/2010 | Premerlani et al. | |
| 2011/0085272 A1 | 4/2011 | Schweitzer, III et al. | |

OTHER PUBLICATIONS

Khorashadi-Zadeh "Application of Fuzzy Neuro for Generator Stator Earth Fault Detection" 7th Seminar on Neral Network Applications in Electrical Engineering. Sep. 23-25, 2004 pp. 127-130, IEEE 2004.

Pillai Grounding and Ground Faul Protection of Multiple Generator Installations on Medium-Voltage Industrial and Commercial Power System—part 3: Protection Methods, 4 pages IEEE 2003.

\* cited by examiner

DETECTION OF GENERATOR STATOR INTER-CIRCUIT FAULTS

BACKGROUND OF THE INVENTION

The subject matter disclosed herein relates generally to a multi-circuit generator stator and, more particularly, to a system for detecting generator stator inter-circuit faults.

Present day competitive market space for higher frame generators has challenged original equipment manufacturers to develop generators with increasing power density. This is achieved by providing generators with improved cooling methods and also introducing parallel circuits in each phase. In order to ensure reliable operation and enhanced availability of these units, manufacturers are obliged per applicable international codes and standards to provide protection systems in place that will ensure isolation of the unit in case of an internal fault.

For example, current protection systems provide stator ground fault protection through 100% stator ground fault detection (64TN), $3^{rd}$ harmonic stator ground fault detection (27TN), neutral over-voltage detection (59N), and auxiliary over-voltage detection (59X).

BRIEF DESCRIPTION OF THE INVENTION

Aspects of the invention provide a system and method for detecting inter-circuit faults within a generator stator. In one embodiment, a computer system includes: a sampler for sampling phase voltages and phase currents of a generator; a plurality of pre-defined blocks for enabling, based on the sampled phase voltages and currents, an inter-circuit fault detection scheme; a level detection block for determining, in response to the enabled inter-circuit fault detection scheme, a plurality of differences between the sampled phase voltages; and a comparison logic device for comparing, in response to the enabled inter-circuit fault detection scheme, each of the differences of the sampled phase voltages and determining, based on the differences, an inter-circuit fault within at least one phase of the generator stator. The system may also include a negative sequence voltage block for detection of generator phase voltage unbalance.

A first aspect of the disclosure provides a computer system, comprising: a sampler for sampling phase voltages and phase currents of a generator stator; a plurality of pre-defined blocks for enabling, based on the sampled phase voltages and currents, an inter-circuit fault detection scheme; a level detection block for determining, in response to the enabled inter-circuit fault detection scheme, a plurality of differences between the sampled phase voltages; and a comparison logic device for comparing, in response to the enabled inter-circuit fault detection scheme, each of the differences of the sampled phase voltages and determining, based on the differences, an inter-circuit fault within at least one phase of the generator stator.

A second aspect provides a computer program comprising program code embodied in at least one computer-readable medium, which when executed, enables a computer system to implement a method of detecting inter-circuit faults within a generator stator, the method comprising: sampling phase voltages of the generator stator; sampling phase currents of the generator stator; enabling, based on the sampled phase voltages and currents, an inter-circuit fault detection scheme; determining, in response to the enabling, a plurality of differences between the sampled phase voltages; and comparing, in response to the enabling, each of the differences of the sampled phase voltages and determining, based on the differences, an inter-circuit fault within at least one phase of the generator stator.

A third aspect provides a computer-implemented method for detecting inter-circuit faults within a generator stator, the method comprising: sampling phase voltages of the generator stator; sampling phase currents of the generator stator; enabling, based on the sampled phase voltages and phase currents, an inter-circuit fault detection scheme; determining, in response to the enabling, a plurality of differences between the sampled phase voltages; and comparing, in response to the enabling, each of the differences of the sampled phase voltages and determining, based on the differences, an inter-circuit fault within at least one phase of the generator stator.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION OF THE INVENTION

As mentioned above, the subject matter disclosed herein relates generally to a multi-circuit generator stator and, more particularly, to a system for detecting generator stator inter-circuit faults.

Present day competitive market space for higher frame generators has challenged original equipment manufacturers to develop generators with higher power density. This is achieved by providing generators with improved cooling methods and also introducing parallel circuits in each phase. In order to ensure reliable operation and enhanced availability of these units, manufacturers are obliged to provide protection systems in place per international standards and grid codes that will ensure isolation of the unit in case of an internal fault.

For example, current protection systems provide stator ground fault protection through 100% stator ground fault detection (64TN), $3^{rd}$ harmonic stator ground fault detection (27TN), neutral over-voltage detection (59N), and auxiliary over-voltage detection (59X). Phase-phase faults can be detected using differential protection (87). Existing systems can detect inter-turn faults, where a short occurs between two turns of a given circuit, and inter-phase faults, where a short occurs between turns of two different phases (e.g. between a turn of one phase and a turn of another phase), but none of the current protection systems provide capability of detecting an inter-circuit fault in a multi-circuit generator stator to prevent catastrophic damage to a monitored generator.

An inter-circuit fault differs from other inter-turn faults in that an inter-circuit fault occurs between turns of different circuits within a phase of a multi-phase generator, which can include between respective end windings of two circuits in a phase and/or between an end winding of one circuit and a turn of another circuit in the same phase. In other words, a short occurs between a turn of one circuit of a phase and a turn of another, different circuit in the same phase. Initially, such an inter-circuit fault can circulate high current that can cause melting and/or vaporization of the conductors involved, and if this continues can cause other faults, particularly ground faults. For example, in one documented event where a fault occurred between an end winding of one circuit of a phase and a turn of another circuit of the same phase, such high current caused the copper conductor(s) in the end-winding connection of the phase to melt and vaporize, which resulted in copper spraying out of the lower leads area for 13 seconds until the fault metamorphosed into a ground fault that was detected by the fault monitoring system. The resulting damage from the inter-circuit fault rendered the stator of the generator unsalvageable, resulting in significant financial loss and downtime of the generator. Had the inter-circuit fault been detected as opposed to the eventual ground fault, much damage could have been avoided, as well as associated financial loss and generator downtime.

Through analysis of data gathered by monitoring and/or control systems during inter-circuit fault events, it was determined that certain criteria can be used to block invocation of an inter-circuit fault detection scheme, and thus reduce processor load, the risk of false positives, and other potential problems. More specifically, if a fault is outside the generator, if the neutral overvoltage of any phase is no more than 20% of the rated $V_{rms}$, if the neutral overvoltage of any two phases is less than 60% of the rated $V_{rms}$, and if the absolute value of specific differences between measured $V_{rms}$ of phases is less than 10% rated $V_{rms}$, then there is no inter-circuit fault. If one of these criteria is not met, there still may not be an inter-circuit fault, but the inter-circuit fault detection scheme according to embodiments can be invoked to determine whether such a fault has occurred.

Figure 1:
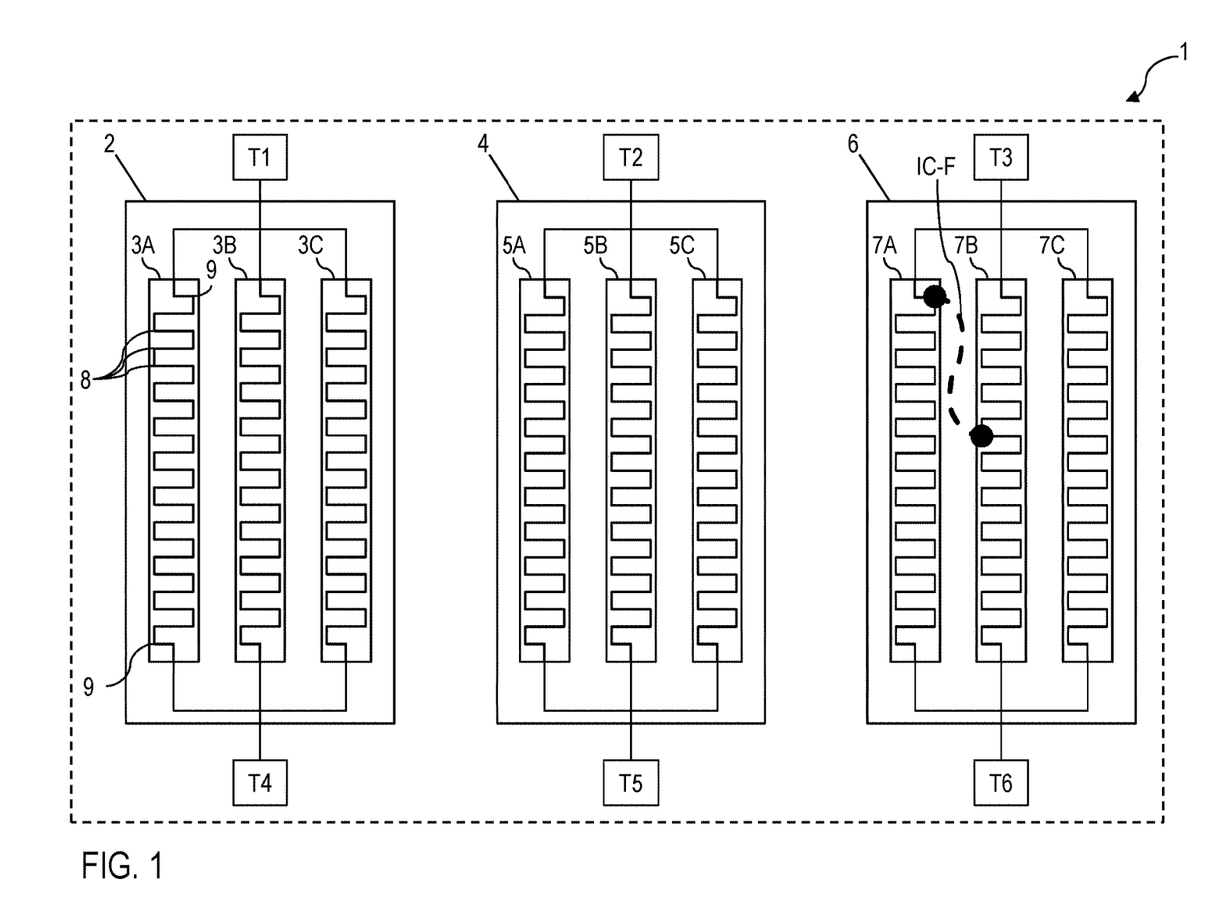
FIG. 1 shows a circuit diagram of the phases of the windings for a multi-circuit generator stator according to an embodiment of the invention.

Turning now to FIG. 1, a circuit diagram of the phases 2, 4, 6 of the winding 1 for a generator stator 12 (FIG. 2) according to embodiments of the invention is shown. As shown, terminals or leads T1 and T4 can form the first phase 2, terminals or leads T2 and T5 can form the second phase 4, and terminals or leads T3 and T6 can form the third phase 6. Between each pair of leads for each phase can be a plurality of parallel circuits, here labeled A, B, and C, for each phase. Thus, first phase 2 can include three parallel circuits 3A, 3B, 3C each extending between leads T1 and T4, second phase 4 can include three parallel circuits 5A, 5B, 5C each extending between leads T2 and T5, and third phase 6 can include three parallel circuits 7A, 7B, 7C extending between leads T3 and T6.

Each circuit within each phase can include a plurality of turns 8, also referred to as windings, of a conductor, such as copper, end windings 9 of which can be connected to respective terminals. To avoid clutter in the FIG., only three turns 8 of circuit 3A have been specifically identified with lead lines, but it should be understood that the elements of similar appearance shown in circuit 3A between end windings 9 are also turns. Also, while turns 8 and end windings 9 are only specifically identified with reference numerals and lead lines in circuit 3A to avoid clutter in the FIG., it should be understood that all of the circuits shown in FIG. 1 include such turns and end windings. Additionally, FIG. 1 shows each circuit including a particular number of turns, but the specific number of turns in each circuit, and the specific number of circuits in each phase, can vary depending on a number of design factors of the generator as is known in the art, such as the operational loads for which the generator is designed. Further, it should be noted that alternate nomenclature for the phases will be used in portions of the description below, where first phase 2 can be referred to as an A-Phase, second phase 4 can be referred to as a B-Phase, and third phase 6 can be referred to as a C-Phase, not to be confused with the circuits within each phase.

As indicated above, an inter-circuit fault is a fault that occurs between the circuits of a phase. For example, between leads T3 and T6 for third phase 6 are circuits 7A, 7B, and 7C, and an inter-circuit fault would be a fault that occurs between circuits 7A and 7B, such as inter-circuit fault path IC-F between an end winding of circuit 7A and a turn of circuit 7B, which was the initial fault path observed in the example event described above. This is only an example, of course, and an inter-circuit fault could occur between a turn of circuit 7B and a turn of circuit 7C, between respective turns of circuits 7A and 7C, or between respective turns of circuits in other phases. Again, "turn" here can include an end winding. As noted above, inter-circuit faults of these types, undetected and/or not isolated, can cause catastrophic damage to generator stators.

Aspects of the invention provide a system and method for detecting such inter-circuit faults within a generator stator. In one embodiment, a computer system includes: a sampler for sampling phase voltages and phase currents of a generator, which can include lines to receive readings from one or more voltmeters and/or ammeters for each phase so that sampling phase voltages can include measuring the phase voltages, and so that sampling phase currents can include measuring the phase currents. In addition, the system can include a plurality of pre-defined blocks for enabling, based on the sampled phase voltages and currents, an inter-circuit fault detection scheme, such that each pre-defined block can prevent the detection scheme from being used and/or executed. That is, each pre-defined block can block usage/execution of the detection scheme. Further, the system can include a level detection block for determining, in response to the enabled inter-circuit fault detection scheme, a plurality of differences between the sampled phase voltages so that the detection scheme can still be blocked if the level detection block determines that pre-defined criteria are not met. The system can also include a comparison logic device for comparing, in response to the enabled inter-circuit fault detection scheme, each of the differences of the sampled phase voltages and determining, based on the differences, an inter-circuit fault is present within at least one phase of the generator stator. The system may also include a negative sequence voltage block for detection of phase voltage unbalance within a generator stator. The technical effect of such a system is the ability to detect inter-circuit faults within a generator stator and to produce a signal that can be used to take the generator off line when such a fault is detected. The inter-circuit fault detection scheme provided by this disclosure may be implemented in existing and any future generator protection relays.

Figure 2:
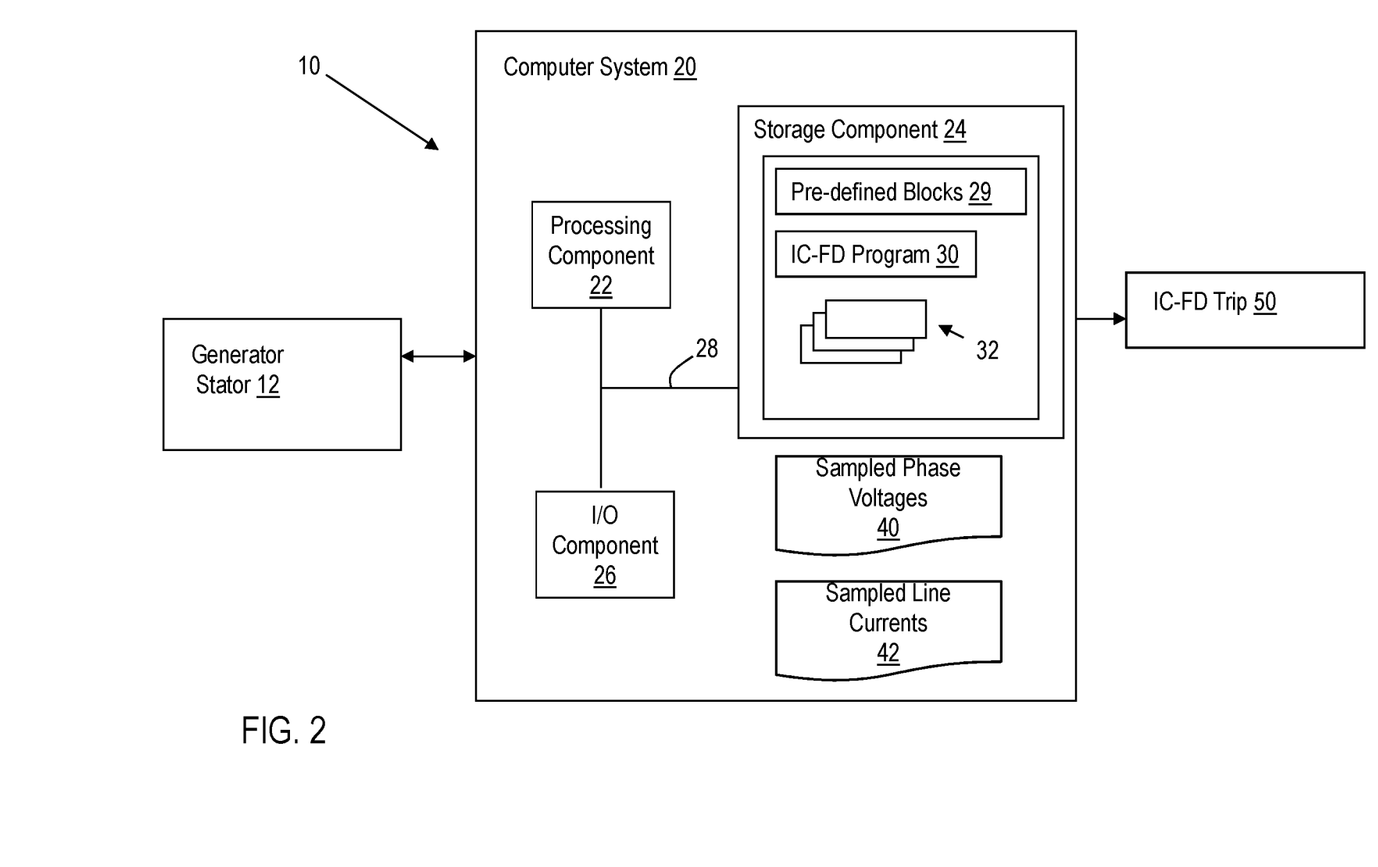
FIG. 2 shows an illustrative environment for detecting inter-circuit faults in a generator stator according to an embodiment of the invention.

FIG. 2 shows an illustrative environment 10 for detecting inter-circuit faults on a generator stator 12 according to some embodiments of the invention. To this extent, environment 10 includes a computer system 20 that can perform a process described herein in order to detect inter-circuit faults within a generator stator 12. In particular, computer system 20 is shown including an inter-circuit fault detection (IC-FD) program 30, which makes computer system 20 operable to detect inter-circuit faults within a generator stator 12 by performing a process described herein. Further shown in computer system 20 are pre-defined blocks 29, which, as will be described later herein, enable IC-FD program 30.

Computer system 20 is shown including a processing component 22 (e.g., one or more processors), a storage component 24 (e.g., a storage hierarchy), an input/output (I/O) component 26 (e.g., one or more I/O interfaces and/or devices), and a communications pathway 28. In general, processing component 22 executes program code, such as pre-defined blocks 29 and/or IC-FD program 30, which are at least partially fixed in storage component 24. While executing program code, processing component 22 can process data, which can result in reading and/or writing transformed data from/to storage component 24 and/or I/O component 26 for further processing. Pathway 28 provides a communications link between each of the components in computer system 20. I/O component 26 can comprise one or more I/O devices, which enables user to interact with computer system 20 and/or one or more communications devices to enable a system user to communicate with computer system 20 using any type of communications link. Further, pre-defined blocks 29 and/or IC-FD program 30 can manage (e.g., store, retrieve, create, manipulate, organize, present, etc.) the data, such as sampled phase voltages 40 and/or sampled line currents 42, using any solution.

In any event, computer system 20 can comprise one or more general purpose computing articles of manufacture (e.g., computing devices) capable of executing program code, such as pre-defined blocks 29 and/or IC-FD program 30, installed thereon. As used herein, it is understood that "program code" means any collection of instructions, in any language, code or notation, that cause a computing device having an information processing capability to perform a particular action either directly or after any combination of the following: (a) conversion to another language, code or notation; (b) reproduction in a different material form; and/or (c) decompression. To this extent, pre-defined blocks 29 and/or IC-FD program 30 can be embodied as any combination of system software and/or application software and/or firmware application codes.

Further, pre-defined blocks 29 and/or IC-FD program 30 can be implemented using a set of modules 32. In this case, a module 32 can enable computer system 20 to perform a set of tasks used by pre-defined blocks 29 and/or IC-FD program 30, and can be separately developed and/or implemented apart from other portions of pre-defined blocks 29 and/or IC-FD program 30. As used herein, the term "component" means any configuration of hardware, with or without software, which implements the functionality described in conjunction therewith using any solution, while the term "module" means program code that enables a computer system 20 to implement the actions described in conjunction therewith using any solution. When fixed in a storage component 24 of a computer system 20 that includes a processing component 22, a module is a substantial portion of a component that implements the actions. Regardless, it is understood that two or more components, modules, and/or systems may share some/all of their respective hardware and/or software and/or firmware. Further, it is understood that some of the functionality discussed herein may not be implemented or additional functionality may be included as part of the computer system 20.

When computer system 20 comprises multiple computing devices, each computing device can have only a portion of pre-defined blocks 29 and/or IC-FD program 30 fixed thereon (e.g., one or more modules 32). However, it is understood that computer system 20, pre-defined blocks 29, and/or IC-FD program 30 are only representative of various possible equivalent computer systems that may perform a process described herein. To this extent, in other embodiments, the functionality provided by computer system 20, pre-defined blocks 29 and/or IC-FD program 30 can be at least partially implemented by one or more computing devices that include any combination of general and/or specific purpose hardware with or without program code. In each embodiment, the hardware, firmware and program code, if included, can be created using standard engineering and programming techniques, respectively.

Regardless, when computer system 20 includes multiple computing devices, the computing devices can communicate over any type of communications link. Further, while performing a process described herein, computer system 20 can communicate with one or more other computer systems using any type of communications link. In either case, the communications link can comprise any combination of various types of optical fiber, wired, and/or wireless links; comprise any combination of one or more types of networks; and/or utilize any combination of various types of transmission techniques and protocols.

As discussed herein, pre-defined blocks 29 and IC-FD program 30 enable computer system 20 to detect inter-circuit faults in a generator stator 12. As shown in FIG. 1, if an inter-circuit fault is detected, computer system 20 will generate an IC-FD Trip signal 50. Such trip signal can be utilized to isolate and de-energize the generator stator 12, such as by causing a switch, breaker, or other device to interrupt operation thereof.

Figure 3A:
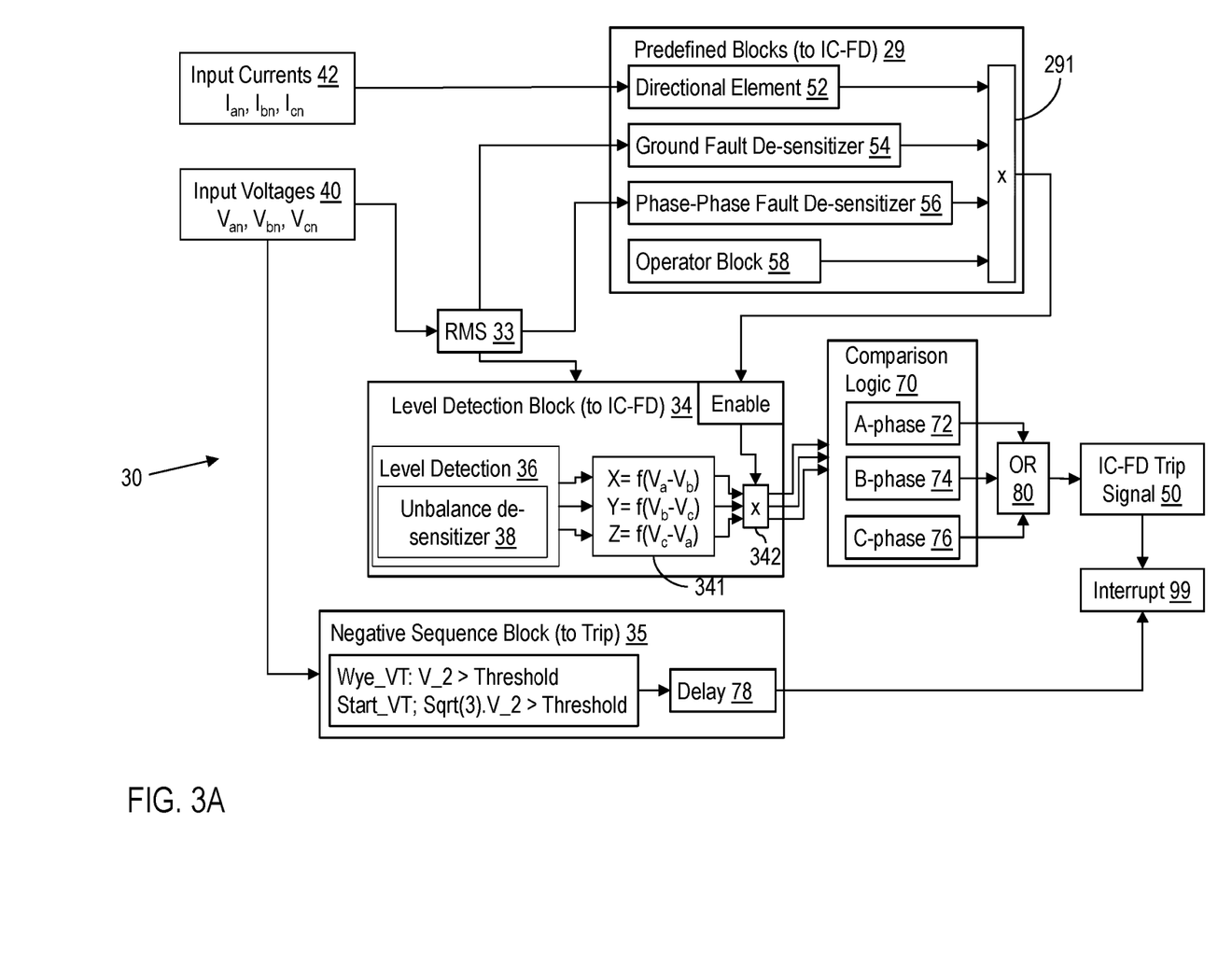
FIG. 3A shows a schematic block diagram of a system for detecting inter-circuit faults in a generator stator according to embodiments of the invention.
Figure 3B:
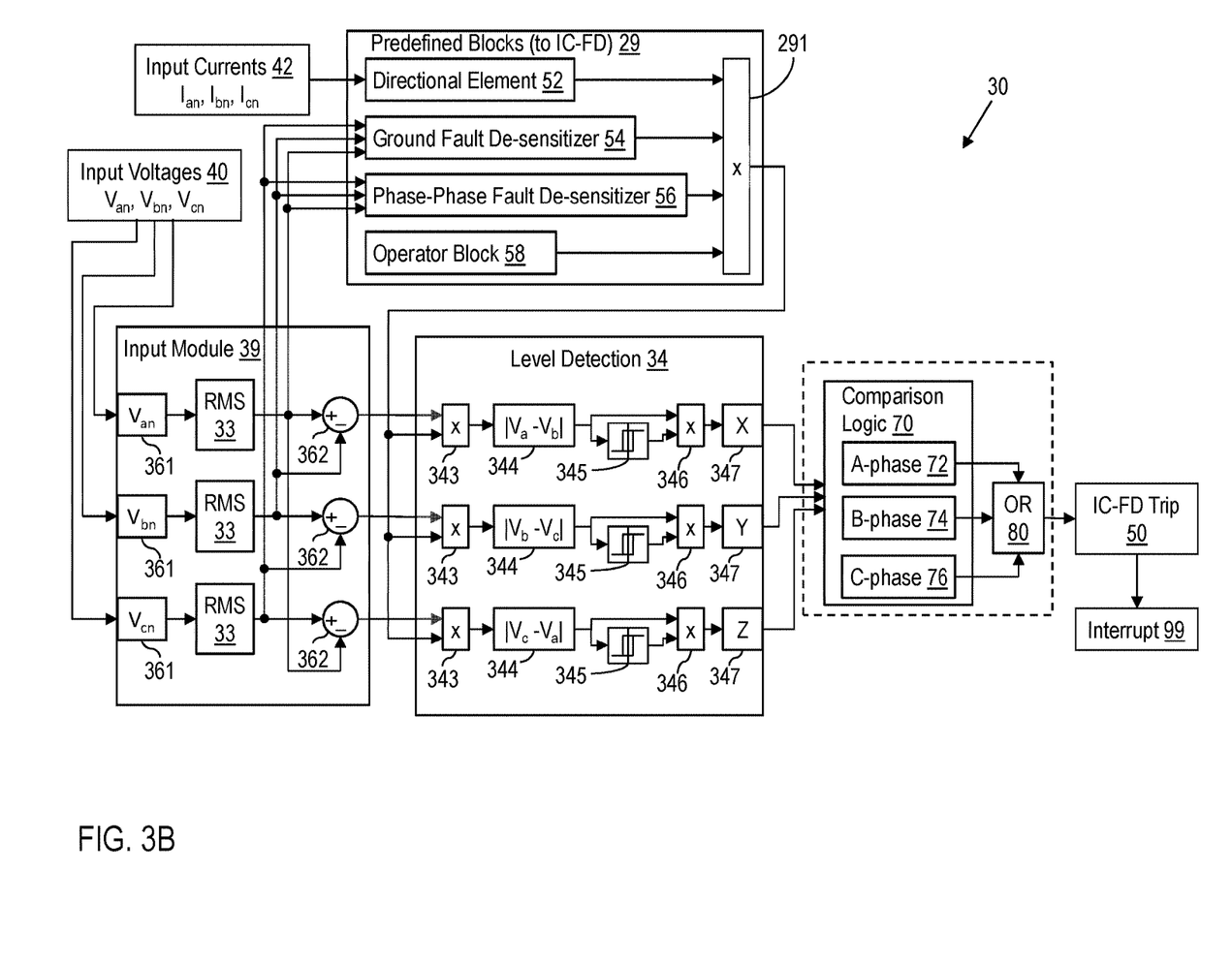
FIG. 3B shows a schematic block diagram of a system for detecting inter-circuit faults in a generator stator according to embodiments of the invention.
Figure 3C:
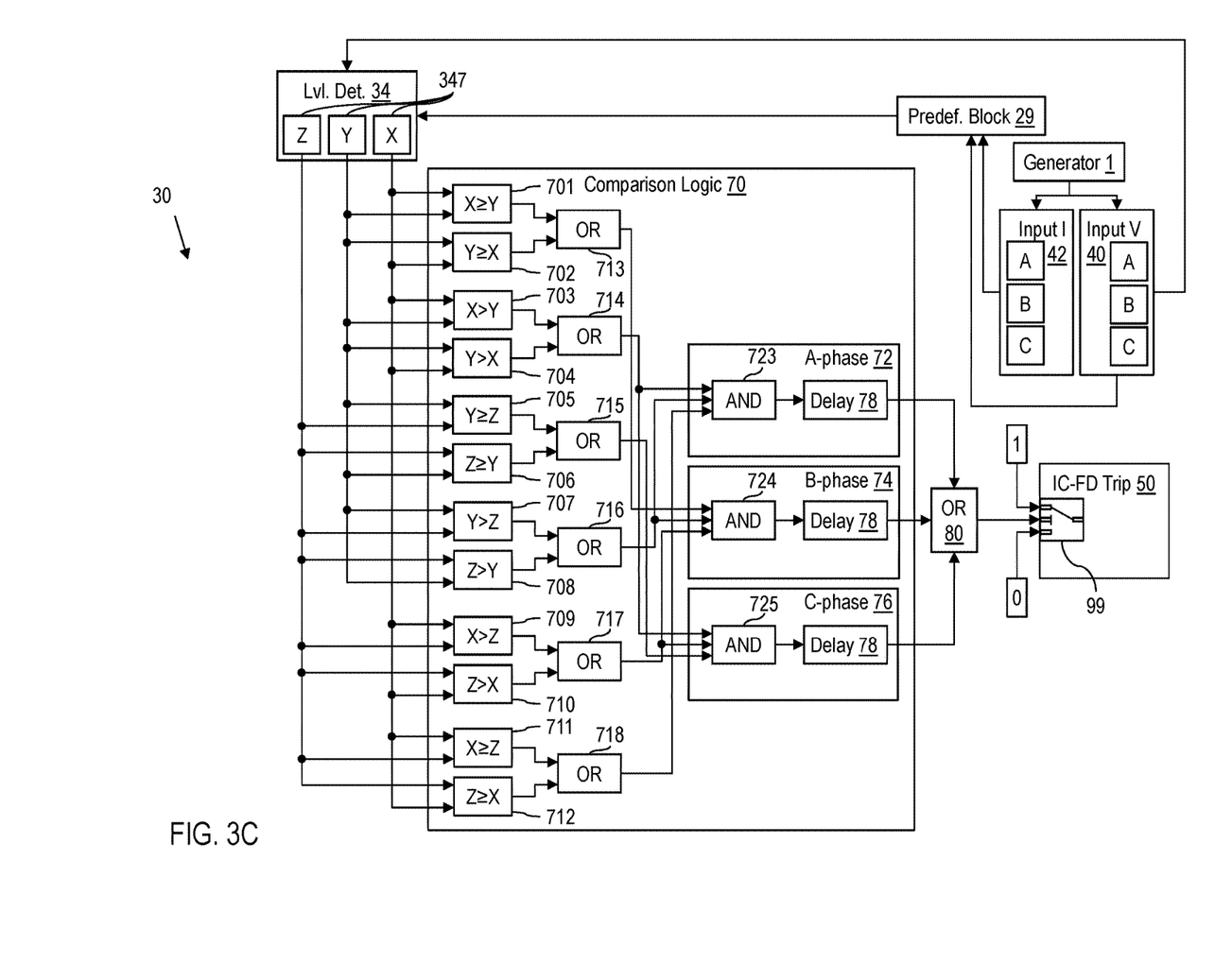
FIG. 3C shows a schematic block diagram of a system for detecting inter-circuit faults in a generator stator according to embodiments of the invention.
Figure 4:
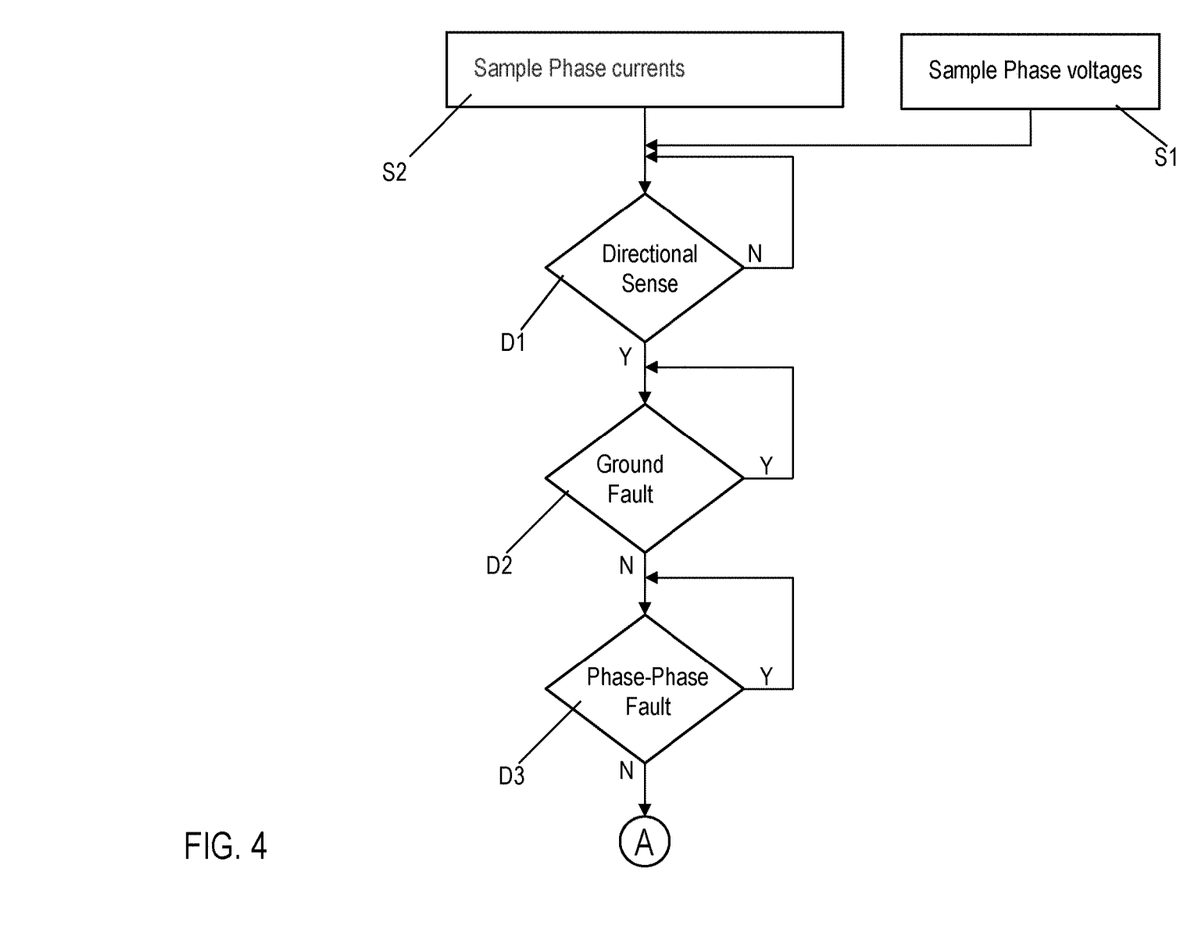
FIG. 4 shows a flow diagram of a method for detecting inter-circuit faults in a generator stator according to embodiments of the invention.
Figure 5:
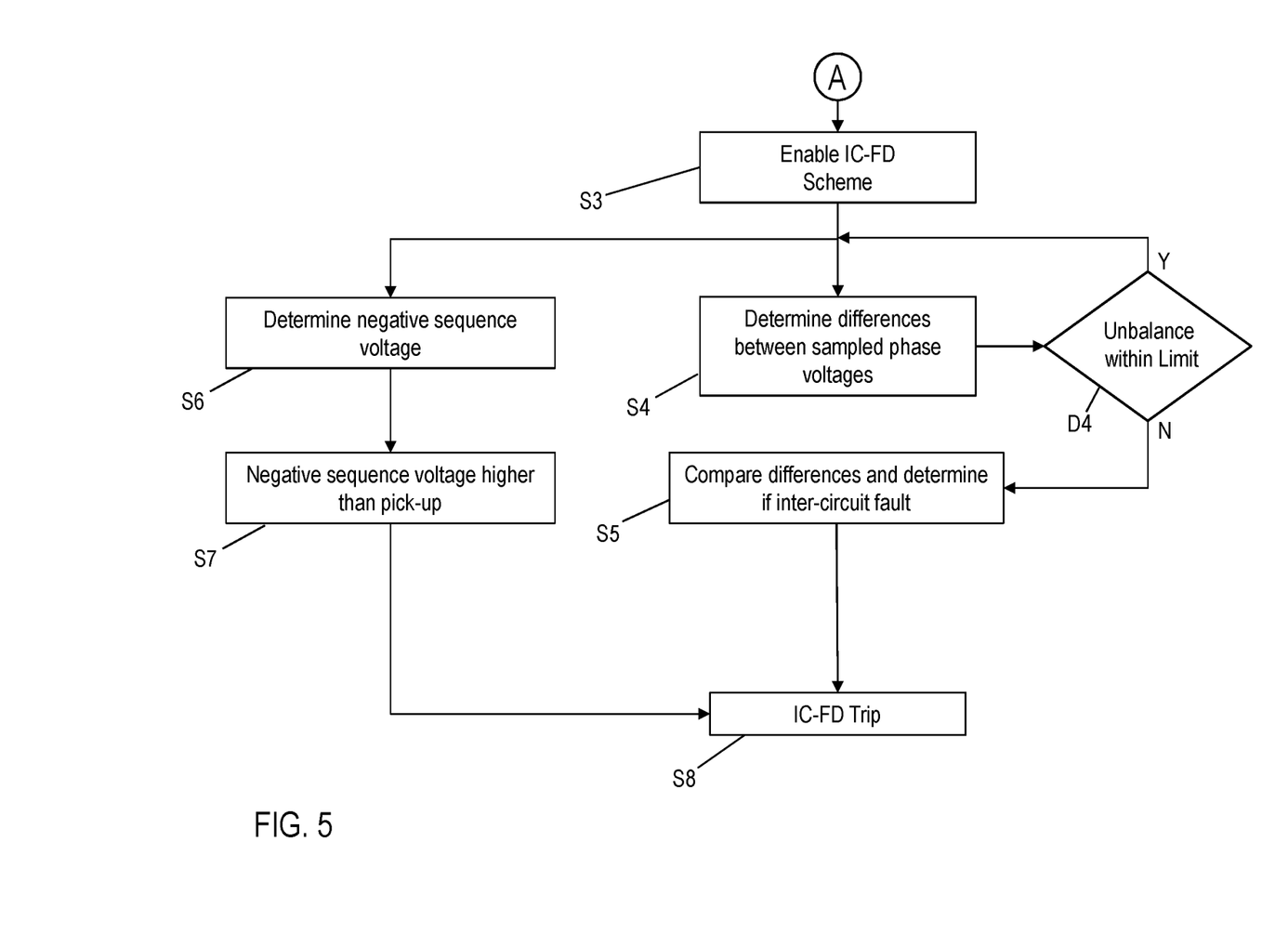
FIG. 5 shows a flow diagram of a method for detecting inter-circuit faults in a generator stator according to embodiments of the invention.
Figure 6:
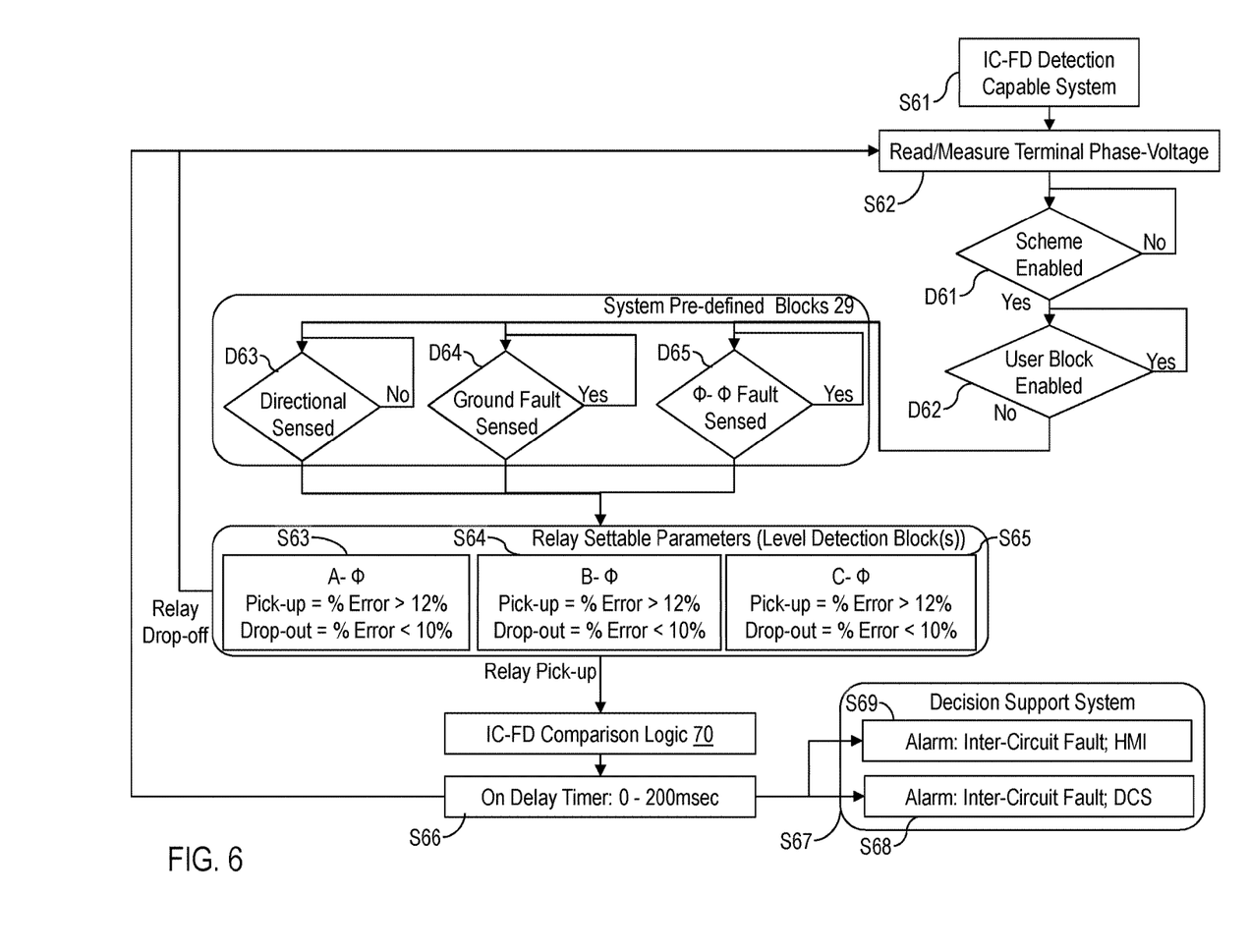
FIG. 6 shows a flow diagram of a method for detecting inter-circuit faults in a generator stator according to embodiments of the invention.

Turning now to FIG. 3A-3C, schematic block diagrams of a system for detecting inter-circuit faults in a generator stator 12 (FIG. 2) according to embodiments of the invention are shown. FIGS. 4-6 show flow diagrams of a method for detecting inter-circuit faults using the system(s) shown in FIGS. 1-3C. It should be apparent to one skilled in the art that embodiments can be rendered in a hardware implementation, a software implementation, and/or a combination of hardware and software.

As seen, for example, in FIG. 3A, input voltages 40 ($V_a$, $V_b$, $V_c$) for each phase can be acquired, such as by using one or more voltmeters in winding 1 (FIG. 1) or by any other suitable technique known in the art. Likewise, input currents 42 ($I_a$, $I_b$, $I_c$) for each phase can be acquired, such as by using one or more ammeters in winding 1 (FIG. 1) or by any other suitable technique known in the art. At some points in this description, acquisition of voltage and/or current values may be referred to as "sampling" phase voltage(s) and/or phase current(s) using a "sampler," by which is meant that one or more sample values of each property is acquired, such as by using a voltmeter for voltage or an ammeter for current, and such as by taking measurements periodically at a "sample rate" so that a plurality of values are measured over time.

Again referring to FIG. 3A, various blocks serve to prevent ("block") the use of IC-FD unless other types of faults have been ruled out, voltage levels are within predefined ranges in which IC-FD is desired, and a negative sequence is not present, some of which can be based on sampled phase currents, sampled phase voltages, and/or processed sampled phase voltages. In embodiments, one or more root mean square (RMS) devices 33 can receive input/sampled phase voltages 40 and can process measured values to obtain RMS values for each phase voltage. For example, each RMS device 33 can take the form of a true RMS converter that receives an AC voltage signal and outputs a DC voltage signal equal to the RMS voltage of the AC voltage received, or a circuit can be implemented to calculate the RMS voltage in another well-known fashion.

A plurality of predefined blocks 29 can include a directional element 52 based on input currents 42, a ground fault desensitizer 54 receiving RMS phase voltage values from RMS device(s) 33, a phase-phase fault de-sensitizer 56 receiving RMS phase voltage values from RMS device(s) 33, and/or an operator block 58 with which an operator can prevent IC-FD from being used. The plurality of predefined blocks 29 can be implemented using known techniques as suggested above, and the outputs of the blocks can have binary values, i.e. 0 or 1, sent to a multiplier 291. Multiplier 291 can output a 0 or 1 that can be used as an enabling signal, such as to be used in a level detection block 34 to effectively enable IC-FD comparison logic 70 as will be described. Output of multiplier 291 can thus have a value of 1 only when all blocks output a value of 1 and will have a value of 0 if even one of the blocks output a value of 0.

Level detection block 34, in addition to receiving output of multiplier 291, can receive RMS phase voltage values from RMS device(s) 33, which can be used in level detection 36 and unbalance desensitizer 38 to determine a plurality of voltage differences X, Y, Z in element 341. For example, one or more adder-subtractors or subtractors can be used to determine the voltage differences as is known in the art. Voltage differences X, Y, Z can be viewed as error signals and can be expressed as $$X=f(V_a-V_b), \quad (1)$$

$$Y=f(V_b-V_c), \quad (2)$$

$$Z=f(V_c-V_a). \quad (3)$$

In embodiments, element 341 can be configured to receive processed RMS phase voltage values from level detection 36 and determine differences/error signals X, Y, Z. These differences X, Y, Z can each be multiplied in a multiplier 342 by the output of multiplier 291 so that the values of differences X, Y, Z are sent to comparison logic 70 only when the output of multiplier 291 has a value of 1, in which case comparison logic 70 is enabled.

A negative sequence block 35 can receive input voltages 40 directly rather than via RMS device 33 in embodiments and can be processed to obtain a negative sequence voltage (V_2). Negative sequence voltage (V_2) can be compared with a user settable threshold to detect an over voltage condition (59_2), and can be used to detect loss of one or two phases, or a non-symmetrical voltage condition, that corresponds to an inter-circuit fault condition. Negative sequence block 35 can employ known techniques, such as those indicated in FIG. 3A, and threshold values, user-settable or predefined, to determine when a negative sequence is present that should result in a trip of a breaker or other interrupt 99.

Comparison logic 70 can include an A-phase branch 72, a B-phase branch 74, and a C-phase branch 76 that apply various comparisons of the error signals X, Y, Z to produce a binary/logical value for each phase to represent detection of an IC-F. Broadly, branches 72, 74, 76 can include logical elements such that:

$$A\text{-Phase 72 IC-FD}=f_1\{(X,Y) \text{ AND } (Y,Z) \text{ AND } (X,Z)\}, \quad (4)$$

$$B\text{-Phase 74 IC-FD}=f_2\{(X,Y) \text{ AND } (Y,Z) \text{ AND } (X,Z)\}, \quad (5)$$

$$C\text{-Phase 76 IC-FD}=f_3\{(X,Y) \text{ AND } (Y,Z) \text{ AND } (X,Z)\}. \quad (6)$$

Output of the branches 72, 74, 76 can be fed to an OR gate 80 such that detection of an IC-F in one branch results in an IF-FD trip signal 50, which can result in activation of interrupt 99.

With reference to FIG. 3B, another implementation of embodiments is shown in which difference values/error signals X, Y, Z can be more specifically expressed as:

$$X=|V_a-V_b| \quad (7)$$

$$Y=|V_b-V_c|, \text{ and} \quad (8)$$

$$Z=|V_c-V_a|. \quad (9)$$

As shown, this implementation can include input voltages 40, input currents 42, predefined blocks 29, comparison logic 70, IC-FD trip signal 50, and interrupt 99 as in FIG. 3A. However, the implementation of FIG. 3B can include an input module 39 receiving input voltages 40 via input terminals or the like 361 connected to respective RMS devices 33 that each output a RMS voltage value for a respective phase. Outputs of RMS devices 33 can be connected to difference devices 362, such as adder-subtractors or subtractors, so that, for example, differences $(V_a-V_b)$, $(V_b-V_c)$, and $(V_c-V_a)$ can be determined and output to level detection 34. These differences can be received by respective multipliers 343 of level detection 34 that multiply the respective differences by the output of multiplier 291 so that each multiplier 343 will output 0 when the output of multiplier 291 is 0, or the respective received difference value when the output of multiplier 291 is 1. The output of each multiplier 343 can be sent to a respective absolute value determining element 344 to produce difference values/error signals $X=|V_a-V_b|=|V_b-V_c|$, and $Z=|V_c-V_a|$. Absolute value determining element 344 can be any known and/or suitable circuit or device that can determine absolute value, which should easily be within the ken of one of ordinary skill in the art. Inasmuch as circuits to determine the absolute value of a difference between two input voltages are well known in the art, such a device could be employed in place of difference device(s) 362 and element(s) 344 could be eliminated.

Error signals X, Y, Z can be sent to comparison logic 70 directly, but as shown can also first be sent to a respective multiplier 346 in two paths, one of which passes through a respective relay 345. Each relay 345 can allow introduction of a threshold value or the like, such as by an operator, below which its output can be 0 so that the value of the respective voltage difference/error signal X, Y, Z 347 will be rendered 0 by respective multiplier 346. The use of relays 345 can thus constitute a load unbalance desensitizer, typically using a ±10% unbalance limit that can be set, such as by an operator, to allow phase loading unbalance.

Turning now to FIG. 3C, an implementation of embodiments is shown with an example of an implementation of comparison logic 70. As in FIG. 3A, voltages 40 and currents 42 of a generator 1, such as phases A, B, C of stator 12 above (FIG. 2), can be measured/sampled and provided to a plurality of predefined blocks 29 and level detection block 34. The particular implementations of these elements can be as in FIG. 3A or FIG. 3B or another implementation, so long as suitable input voltages 40 can be provided to level detection block 34 to produce error signals X, Y, Z 347, which can be selectively enabled using an output value of predefined blocks 29. It should be noted that input currents 42 are used only when a directional element block 52 is present in plurality of blocks 29, and that level detection block 34 and comparison logic 70 only need input voltages 40 for IC-FD program/scheme/system 30.

As seen in FIG. 3C, comparison logic 70 can include a plurality of comparators 701-712 receiving various combinations of error signals X, Y, Z and outputting logical results to a plurality of OR gates 713-722. For example, comparators 701-704 can receive both error signal X and error signal Y such that comparator 701 can output a logical high (1) when error signal X is greater than or equal to error signal Y, comparator 702 can output a logical high (1) when error signal Y is greater than or equal to error signal X, comparator 703 can output a logical high (1) when error signal X is greater than error signal Y, and comparator 704 can output a logical high (1) when error signal Y is greater than rror signal X. Similarly, comparators 705-708 can receive both error signal Y and error signal Z such that comparator 705 can output a logical high (1) when error signal Y is greater than or equal to error signal Z, comparator 706 can output a logical high (1) when error signal Z is greater than or equal to error signal Y, comparator 707 can output a logical high (1) when error signal Y is greater than error signal Z, and comparator 708 can output a logical high (1) when error signal Z is greater than error signal Y. Likewise, comparators 709-712 can receive both error signal X and error signal Z such that comparator 709 can output a logical high (1) when error signal X is greater than error signal Z, comparator 710 can output a logical high (1) when error signal Z is greater than error signal X, comparator 711 can output a logical high (1) when error signal X is greater than or equal to error signal Z, and comparator 712 can output a logical high (1) when error signal Z is greater than or equal to error signal Z.

The outputs of comparators 701 and 702 can be sent to OR gate 713, the outputs of comparators 703 and 704 can be sent to OR gate 714, the outputs of comparators 705 and 706 can be sent to OR gate 715, the outputs of comparators 707 and 708 can be sent to OR gate 716, the outputs of comparators 709 and 710 can be sent to OR gate 717, the outputs of comparators 711 and 712 can be sent to OR gate 718. The outputs of OR gates 714, 716, and 718 can be sent to an AND gate 719 of A-phase branch 72, while the outputs of OR gates 713, 716, and 717 can be sent to an AND gate 720 of B-phase branch 74, and the outputs of OR gates 714, 717, and 715 can be sent to an AND gate of C-phase branch 76. The outputs of A-phase branch 72, B-phase branch 74, and C-phase branch 76 can be sent to an OR gate 80 as in other embodiments, but can each include a delay 78, such as a timer, so that transient detection of IC-F in a phase will not result in activation of IC-FD trip 50 and interruption of operation of generator 1.

Comparison logic 70 as shown in FIG. 3C can also be expressed as:

$$A\text{-Phase 72 IC-FD}=[\{(X>Y) \text{ OR } (Y>X)\} \text{ AND } \{(Y>Z) \text{ OR } (Z>Y)\} \text{ AND } \{(X>Z) \text{ OR } (Z>X)\}] \quad (10)$$

$$B\text{-Phase 74 IC-FD}=[\{(X>Y) \text{ OR } (Y>X)\} \text{ AND } \{(Y>Z) \text{ OR } (Z>Y)\} \text{ AND } \{(X>Z) \text{ OR } (Z>X)\}] \quad (11)$$

$$C\text{-Phase 76 IC-FD}=[\{(X>Y) \text{ OR } (Y>X)\} \text{ AND } \{(Y>Z) \text{ OR } (Z>Y)\} \text{ AND } \{(X>Z) \text{ OR } (Z>X)\}] \quad (12)$$

where each of Eqs. (10)-(12) yields a logical high (1) when an IC-F is detected. It should be recognized that Eqs. (10)-(12) are a particular implementation of comparison logic 70 and that other implementations could be employed within the scope of embodiments.

Turning to FIGS. 4-6, with additional reference to FIG. 3A, at 51, a sampler samples phase voltages 40 ($V_a$, $V_b$, $V_c$) for each phase of the generator stator 12 (FIG. 2), which can yield input voltages 40 of FIGS. 3A-3C. At S2, the sampler samples phase currents 42 ($I_a$, $I_b$, $I_c$) for each phase of the generator stator 12 (FIG. 2), which can yield input currents 42 of FIGS. 3A-3C. Further, it is understood that phase voltages 40 and phase currents 42 of generator stator 12 may be sampled using any now known or later developed sampling technique, though embodiments contemplate the use of voltmeters and/or ammeters to obtain values used as input voltages 40 and/or input currents 42 as described above.

Plurality of pre-defined blocks 29 can be provided for selectively enabling, based on these sampled phase voltages 40 and phase currents 42, an inter-circuit fault detection (IC-FD) program 30 (i.e., scheme). As shown in FIG. 3A, IC-FD program/system 30 can include a level detection block 34, a comparison logic 70, and a negative sequence block 35. Also, IC-FD program/system 30 can include an "OR" gate 80 receiving outputs of respective phase-specific branches 72, 74, 76 of comparison logic 70.

The plurality of pre-defined blocks 29 enable the IC-FD program 30 only in particular situations, based on the sampled phase voltages 40 and phase currents 42. For example, at D1, the direction of the fault is sensed using directional element 52. That is, directional element 52 determines whether the fault is inside or outside of the generator. If the fault is not within the generator ("N"), then the directional element 52 continues to determine, at D1, whether there is a fault inside the generator. Once the directional element 52 determines that a fault is within the generator ("Y"), at D2, a ground fault de-sensitizer 54 determines, based on the sampled phase voltages 40, whether the fault is a ground fault. The parameter threshold to determine whether a fault is a ground fault may be set by a user. For example, if a sampled phase voltage 40 is less than or equal to approximately twenty percent (20%) rated, then the fault may be considered by the pre-defined blocks 29 as a ground fault ("Y"). In this case, the ground fault de-sensitizer 54, at D2, will continue to determine if a ground fault exists.

Once ground fault de-sensitizer 54 determines that a ground fault does not exist ("N"), a phase-phase fault de-sensitizer 56 determines, at D3, based on the sampled phase voltages 40, whether the fault is a phase-phase fault. The parameter threshold for determining whether a fault is a phase-phase fault may be set by a user. For example, if any two of the sampled phase voltages 40 is less than approximately sixty percent (60%) rated, then the fault may be considered a phase-phase fault. It is only if the fault is not a phase-phase fault ("N"), that the IC-FD program/system 30 is enabled (S3). In this way, the pre-defined blocks (directional element 52, ground fault de-sensitizer 54, and phase-phase fault de-sensitizer 56) prevent IC-FD program/system 30 from being enabled unless the fault is within the generator stator 12 (FIG. 2), the fault is not a ground fault, and the fault is not a phase-phase fault. Pre-defined block 29 can also be provided with an operator block 58, to prevent IC-FD program/system 30, from being enabled. Operator block 58 is a user configurable block that, when selected, will prevent IC-FD program 30 from being enabled. The operator block 58, along with pre-defined blocks, directional element 52, ground fault de-sensitizer 54, and phase-phase fault de-sensitizer 56, collectively prevent IC-FD program 30 from being enabled.

Once IC-FD program/system 30 is enabled, the level detection 36 of the level detection block 34, determines, at S4, the differences between each of the sampled phase root mean square (RMS) voltages 40. As seen in FIG. 3, the sampled voltages 40 go through the RMS block 33 prior to the level detection block 34. With regard to the level detection 36, for example, error signals X, Y, Z can be determined per Eqs. (1)-(3) and/or Eqs. (7)-(9) above. Thus, in embodiments, X is the difference between sampled phase RMS voltage $V_a$ and sampled phase RMS voltage $V_b$. Y is the difference between sampled phase RMS voltage $V_b$ and sampled phase RMS voltage $V_c$. Z is the difference between sampled phase RMS voltage $V_c$ and sampled phase RMS voltage $V_a$. Level detection block 34 also includes an unbalance de-sensitizer 38 that does not allow the comparison logic 70, to run when the unbalance in sampled phase voltages $V_a$, $V_b$, $V_c$ are within user settable limits. For example, at D4, only if the unbalance is not within a pre-defined, user set, limit ("N"), that the comparison logic 70 (S5) is run. Typically, a ±10% unbalance limit can be set to allow phase loading unbalance. Unbalance de-sensitizer 38 may include a plurality of relays, such as relays 345 shown in the implementation of FIG. 3B.

At S5, these differences (X, Y, Z) of the sampled phase RMS voltages 40 are compared by comparison logic 70, a detailed example implementation of which is illustrated in FIG. 3C and which can be expressed as in example Eqs. (10)-(12) above. Based on the differences (X, Y, Z), comparison logic 70, using OR gate 80, determines whether an inter-circuit fault is within at least one phase of the generator stator 12 (FIG. 2). That is, A-phase 72 would be logic high "1" if an inter-circuit fault is within the T1-T4 phase 2 (sampled phase RMS voltage $V_a$). When A-Phase 72 logic high is reached, an A-phase memory flag to register an A-phase inter-circuit fault event can beset high. B-phase 74 would be logic high "1" if an inter-circuit fault is within the T2-T5 phase 4 (sampled phase RMS voltage $V_b$). When B-Phase 74 logic high is reached, a B-phase memory flag to register a B-phase inter-circuit fault event can be set high. C-phase 76 would be logic high "1" if an inter-circuit fault is within the T3-T6 phase 6 (sampled phase RMS voltage $V_c$). When C-Phase 76, logic high is reached, a C-phase memory flag to register a C-phase inter-circuit fault event can be set high. Comparison logic 70 may also include delay 78 (i.e., timer blocks) for each phase 72, 74, 76 to ensure isolation of the generator under a sustained inter-circuit fault as opposed to a transient indication of IC-F, which can eliminate tripping an interrupt due to a false positive determination of IC-F.

Along with the level detection block 34 and comparison logic 70, a parallel negative sequence over-voltage (59_2) block 35 is provided. The negative sequence block 35 receives the sampled voltages 40. Negative sequence block 35 accepts sampled phase voltages 40 through star or delta voltage transformer connections. Sampled phase voltages 40 are processed in negative sequence block 35 in order to obtain a negative sequence voltage (V_2). Negative sequence voltage (V_2) is compared with a user settable threshold to detect over voltage condition (59_2). Negative sequence over-voltage detection through negative sequence block 35 is used to detect loss of one or two phases, or a non-symmetrical voltage condition, that corresponds to an inter-circuit fault condition. At S6, the negative sequence voltages are determined. At S7, if the negative sequence voltage is greater than a threshold settable by user (i.e., a pick-up of a relay), for a preset delay 78, an IC-FD signal is generated. If an inter-circuit fault is detected in any of the phases through a combination of level detection 34 and comparison logic 70, or negative sequence block 35, at S8 an IC-FD trip 50 is generated, which could be used for isolating and de-energizing the generating unit.

While shown sequentially in FIG. 4, predefined blocks 29 can advantageously be performed/can operate substantially simultaneously, such as shown in FIG. 6. More specifically, IC-FD capable system can start at S61, can read/measure terminal phase voltage at S62, can determine whether detection is enabled at D61, and whether user block is enabled at D62. If detection is enabled and user block is not enabled, then the predefined blocks 29 can operate in parallel (D63-D65) to determine whether non-inter-circuit faults have occurred or other conditions are present that should prevent IC-FD from proceeding. When other faults are not detected and other conditions are not present, then relay settable parameters S63-S65 can be employed, and on relay pick-up for any phase, IC-FD comparison logic 70 can be engaged, and if an IC-F is detected, after a delay has elapsed at S66, decision support system S67 can interrupt operation of the generator at S68 and/or use the human-machine interface to notify an operator or control system of the fault at S69.

In operation, an inter-circuit fault detection analysis could be enabled when ground fault desensitizer 54 receives input voltages 40 that are more than 20% of rated RMS voltage value, when phase unbalance desensitizer 36 (or relays 345) receives input voltages 40 that are more than 90% of rated RMS voltage value, and phase-phase fault desensitizer 56 determines that no two phases are less than 60% of rated RMS voltage value. With particular reference to the implementation shown in FIG. 3C, if X>Y or Y>X, then $|V_a-V_b|<|V_b-V_c|$, which means that $V_a>V_c$ or $V_c>V_a$, and if Y>Z or Z>Y, then $|V_b-V_c|<|V_c-V_a|$, which means that $V_b>V_a$ or $V_a>V_b$, and if X>Z or Z>X, then $|V_a-V_b|<|V_c-V_a|$, which means that $V_b-V_c$, and $V_a$ is the least of all voltages, indicative of a fault in A-phase. Alternatively, if X>Z or Z>X, then $|V_a-V_b|<|V_c-V_a|$, which means that $V_b>V_c$ or $V_c>V_b$, and if Y>Z or Z>Y, then $|V_b-V_c|<|V_c-V_a|$, which means that $V_b-V_a$, and $V_c$ is the least of all voltages, indicative of a fault in C-phase. Lastly, a B-phase fault is indicated when Y>Z or Z>Y, meaning that $|V_b-V_c|<|V_c-V_a|$, which means that $V_a>V_b$ or $V_b>V_a$, and if X>Z or Z>X, then $|V_a-V_b|<|V_c-V_a|$, which means that $V_b-V_c$ or $V_c>V_b$, and if X>Y or Y>X, then $|V_a-V_b|>|V_b-V_c|$, which means that $V_c-V_a$, and $V_b$ is the least of all voltages, indicative of a fault in B-phase.

While shown and described herein as a method and system for detecting inter-circuit faults in a generator stator 12 (FIG. 2), it is understood that aspects of the invention further provide various alternative embodiments. For example, in one embodiment, the invention provides a computer program fixed in at least one computer-readable medium, which when executed, enables a computer system to detect inter-circuit faults in a generator stator 12 (FIG. 2).

To this extent, the computer-readable medium includes program code, such as pre-defined blocks 29 and/or IC-FD program 30 (FIG. 2), which implements some or all of a process described herein. It is understood that the term "computer-readable medium" comprises one or more of any type of tangible medium of expression, now known or later developed, from which a copy of the program code can be perceived, reproduced, or otherwise communicated by a computing device. For example, the computer-readable medium can comprise: one or more portable storage articles of manufacture; one or more memory/storage components of a computing device; paper; and/or the like.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A system comprising:
    three input voltage lines electrically connected to at least one voltmeter that is electrically connected to a multiphase generator stator to measure a voltage across each phase of the stator;
    a plurality of pre-defined blocks including at least
        a ground fault de-sensitizer electrically connected to the input voltage lines and determining based on values received therefrom whether a ground fault has occurred,
        a phase-phase fault de-sensitizer connected to the input voltage lines and determining therefrom whether a phase-phase fault has occurred, and
        a multiplier receiving outputs of at least the ground fault de-sensitizer and the phase-phase fault de-sensitizer of the plurality of pre-defined blocks and producing an output signal indicative of a product thereof, the output signal of the multiplier enabling an inter-circuit fault detection (IC-FD) program upon a determination by the ground fault de-sensitizer that no ground fault has occurred and a determination by the phase-phase fault de-sensitizer that no phase-phase fault has occurred;
    at least one root mean square (RMS) device that receives the input voltages and outputs a signal for each phase representative of a respective RMS phase voltage;
    at least three difference devices that each receive a pair of RMS phase voltage signals and output a signal indicative of a difference between the received pair of RMS phase voltage signals;
    at least three absolute value devices that each receive a respective difference from a respective difference device and output an absolute value of the difference as an error signal;
    a comparison logic that receives the error signals, compares combinations of the error signals, and outputs a logic high value for any phase in which an inter-circuit fault is detected; and
    an interrupt device responsive to a logic high value from the comparison logic to interrupt operation of the multiphase generator.

2. The system of claim 1, further comprising a negative sequence over-voltage block for determining, based on the sampled phase voltages, a negative sequence voltage and determining if the negative sequence voltage is greater than a threshold.

3. The system of claim 1, wherein the at least three difference devices are included in a level detection block that further includes an unbalance de-sensitizer for comparing the sampled phase voltages and determining if an unbalance between the sampled phase voltages is within a pre-defined limit.

4. The system of claim 1, wherein the plurality of pre-defined blocks includes a directional element for determining, based on the sampled phase voltages and currents, if a fault is within the generator stator.

5. The system of claim 1, wherein the plurality of pre-defined blocks includes a ground fault de-sensitizer for determining, based on the sampled phase voltages, if a fault is a ground fault.

6. The system of claim 1, wherein the plurality of pre-defined blocks includes a phase-to-phase fault de-sensitizer for determining, based on the sampled phase voltages, if a fault is a phase-phase fault.

7. A computer program comprising program code embodied in at least one non-transitory computer-readable medium, which when executed, enables a computer system to implement a method of detecting inter-circuit faults within a generator stator, the method comprising:
    sampling phase voltages of the generator stator;
    sampling phase currents of the generator stator;
    enabling, based on the sampled phase voltages and currents, an inter-circuit fault detection scheme;
    determining, in response to the enabling, a plurality of differences between the sampled phase voltages; and
    comparing, in response to the enabling, each of the differences of the sampled phase voltages and determining, based on the differences, an inter-circuit fault within at least one phase of the generator stator.

8. The computer program of claim 7, further comprising determining a negative sequence voltage, based on the sampled phase voltages, and determining if the negative sequence voltage is higher than a threshold.

9. The computer program of claim 7, further comprising comparing the sampled phase voltages, and determining if an unbalance between the sampled phase voltages is within a pre-defined limit.

10. The computer program of claim 9, wherein comparing each of the differences of the sampled phase voltages is further in response to determining that the balance between the sampled phase voltages is within the pre-defined limit.

11. The computer program of claim 7, further comprising filtering, using a timer block, to ensure isolation of a generator under a sustained inter-circuit fault.

12. The computer program of claim 7, wherein enabling the inter-circuit fault detection scheme further comprises:

determining, based on the sampled phase voltages and current, if a fault is within the generator stator.

13. The computer program of claim 7, wherein enabling the inter-circuit fault detection scheme further comprises: determining, based on the sampled phase voltages, if a fault is a ground fault.

14. The computer program of claim 7, wherein enabling the inter-circuit fault detection scheme further comprises: determining, based on the sampled phase voltages, if a fault is a phase-phase fault.

15. A computer-implemented method for detecting inter-circuit faults within a generator stator, the method comprising:
sampling phase voltages of the generator stator;
sampling phase currents of the generator stator;
enabling, based on the sampled phase voltages and phase currents, an inter-circuit fault detection scheme;
determining, in response to the enabling, a plurality of differences between the sampled RMS phase voltages; and
comparing, in response to the enabling, each of the differences of the sampled phase voltages and determining, based on the differences, an inter-circuit fault within at least one phase of the generator stator.

16. The computer-implemented method of claim 15, further comprising determining a negative sequence voltage, based on the sampled phase voltages, and determining if the negative sequence voltage is higher than a threshold.

17. The computer-implemented method of claim 15, further comprising comparing the sampled phase voltages, and determining if an unbalance between the sampled phase voltages is within a pre-defined limit.

18. The computer-implemented method of claim 15, wherein enabling the inter-circuit fault detection scheme further comprises: determining, based on the sampled phase voltages and current, if a fault is within the generator stator.

19. The computer-implemented method of claim 15, wherein enabling the inter-circuit fault detection scheme further comprises: determining, based on the sampled phase voltages, if a fault is a ground fault.

20. The computer-implemented method of claim 15, wherein enabling the inter-circuit fault detection scheme further comprises: determining, based on the sampled phase voltages, if a fault is a phase-phase fault.

* * * * *